(12) United States Patent
Elam et al.

(10) Patent No.: US 9,139,905 B2
(45) Date of Patent: Sep. 22, 2015

(54) MICRO-CHANNEL PLATE DETECTOR

(75) Inventors: Jeffrey W. Elam, Elmhurst, IL (US);
Seon W. Lee, Westmont, IL (US);
Hsien-Hau Wang, Downers Grove, IL
(US); Michael J. Pellin, Naperville, IL
(US); Karen Byrum, Batavia, IL (US);
Henry J. Frisch, Chicago, IL (US)

(73) Assignee: UChicago Argonne, LLC, Chicago, IL (US)

( * ) Notice: Subject to any disclaimer, the term of this patent is extended or adjusted under 35 U.S.C. 154(b) by 66 days.

(21) Appl. No.: 13/032,395

(22) Filed: Feb. 22, 2011

(65) Prior Publication Data
US 2011/0210259 A1 Sep. 1, 2011

Related U.S. Application Data

(60) Provisional application No. 61/338,841, filed on Feb. 24, 2010.

(51) Int. Cl.
*H01J 43/06* (2006.01)
*C23C 16/455* (2006.01)
*C23C 16/40* (2006.01)

(52) U.S. Cl.
CPC ......... *C23C 16/45527* (2013.01); *C23C 16/407* (2013.01); *C23C 16/45553* (2013.01)

(58) Field of Classification Search
CPC combination set(s) only.
See application file for complete search history.

(56) References Cited

U.S. PATENT DOCUMENTS

| | | | |
|---|---|---|---|
| 5,391,101 A * | 2/1995 | Aebi et al. | 445/50 |
| 2008/0175982 A1 | 7/2008 | Robinson et al. | |
| 2008/0286448 A1 | 11/2008 | Elam et al. | |
| 2009/0315443 A1 * | 12/2009 | Sullivan et al. | 313/103 CM |

OTHER PUBLICATIONS

Office Action Dated Jan. 29, 2013 for U.S. Appl. No. 12/895,305.
Office Action Dated Oct. 25, 2013 for U.S. Appl. No. 12/895,305.
Office Action for U.S. Appl. No. 12/895,305 dated Jun. 6, 2014.
Office Action Dated Jun. 5, 2014 for U.S. Appl. No. 12/895,305.
Non-Final Office Action for U.S. Appl. No. 12/895,305, mailed Apr. 21, 2015, 12 pages.

* cited by examiner

*Primary Examiner* — Mariceli Santiago
*Assistant Examiner* — Brenitra M Lee
(74) *Attorney, Agent, or Firm* — Foley & Lardner LLP

(57) ABSTRACT

A method and system for providing a micro-channel plate detector. An anodized aluminum oxide membrane is provided and includes a plurality of nanopores which have an Al coating and a thin layer of an emissive oxide material responsive to incident radiation, thereby providing a plurality of radiation sensitive channels for the micro-channel plate detector.

17 Claims, 7 Drawing Sheets

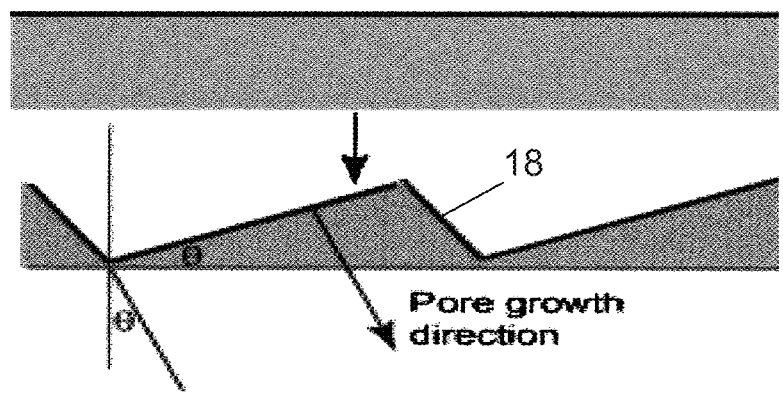
Fig. 10
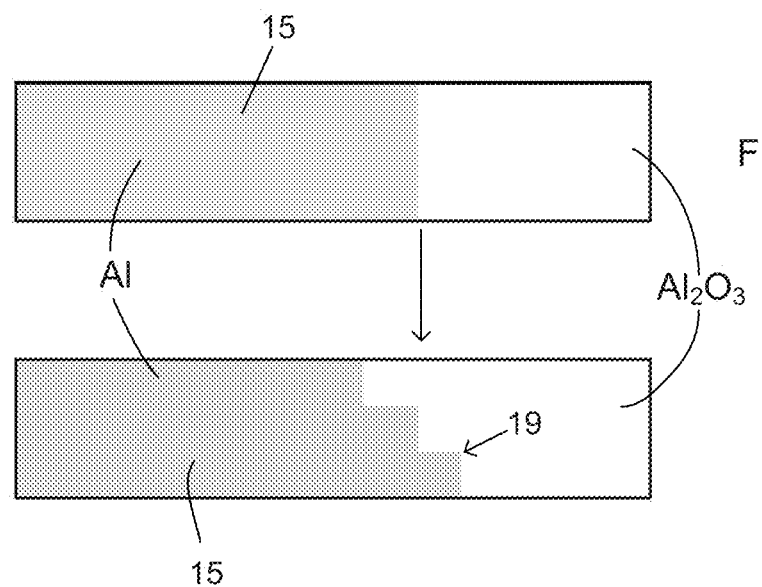
Fig. 11A
Fig. 11B

MICRO-CHANNEL PLATE DETECTOR

CROSS REFERENCE TO RELATED PATENT APPLICATIONS

The present application claims priority to U.S. Provisional Patent Application No. 61/338,841 filed Feb. 24, 2010. The contents of this application are incorporated herein by reference in their entirety.

STATEMENT OF GOVERNMENT INTEREST

The United States Government claims certain rights in this invention pursuant to Contract No. DE-AC02-06CH11357 between the U.S. Department of Energy and UChicago Argonne, LLC, representing Argonne National Laboratory.

FIELD OF THE INVENTION

The present invention relates generally to micro-channel plate (MCP) detectors. More particularly the invention relates to an MCP detector for radiation detection and signal amplification fabricated from an anodized aluminum oxide (AAO) membrane containing nanopores in a range of diameters which have been coated with an atomic layer deposition (ALD) process.

BACKGROUND

A Micro-Channel Plate (MCP) is an array of miniaturized electron multipliers oriented substantially parallel to each other and either parallel or at a bias angle up to about 19° to the plate normal. An MCP typically consists of lead silicate glass and is designed for radiation detection and signal amplification applications. The micro-channels are coated with various chemicals to enhance secondary emission and to improve detection efficiency for a specific source, e.g., UV, soft x-ray, etc. Commercial devices are fabricated with channel diameters 25 microns and below, and the most advanced MCP is equipped with 2 micron channels for high image detail and fast response time. (see, for example MCPs from Burle Technologies, Inc.)

The fabrication of MCP's is generally a multi-step process that involves development of specialty glasses for core and clad, communication fiber glass drawing, assembly into hexagonal array, fusion into a boule, and wafer slicing and processing. The fabrication cost of these processes is very high, large area MCPs are difficult to produce, and the technology to go beyond the sub-micron limit has not been demonstrated.

Anodized aluminum oxide (AAO) has attracted significant interest among the nano-science and engineering research community in recent years. AAO consists of highly aligned nanopores "self-assembled" in a hexagonally close-packed pattern. The pore diameter and pore-to-pore distance range between ~10 to 300 nm and from 30 nm to submicron, respectively. These nanopores can be prepared in a simple wet chemistry lab without complicated equipment. The nanopore diameter and pore distance can be well controlled through anodization parameters as well as postanodization chemical etching. These nanopores are highly ordered within a domain but do not exhibit intrinsic long range order. Nanopores can be filled using electrodeposition to prepare metallic (Cu, Ag, Au, etc.) or ferromagnetic nanowires (Fe, Co, Ni, etc.). These nanoscaled objects have been studied for their magnetic anisotropic behavior and complex multi-segmented nanowires have also been developed. The multi-segmented design may be used to enhance self-assembly of these materials.

Together with chemical vapor deposition (CVD) and atomic layer deposition (ALD), semiconductive nanowires and nanotubes such as ZnO, CdS, CdSe, GaAs, etc., have been synthesized for photonic devices, transistors, and biological sensing and detection applications using AAO membrane. The AAO membrane, when coated through ALD, has been developed into a new membrane catalyst. With precise reaction parameter control, chemical reactions such as dehydrogenation with high selectivity has been demonstrated. The AAO membrane when coated with ZnO was reported to be a high surface area dye-sensitized solar cell with reasonable power efficiency. With short anodization time, a nanowell structure can be prepared with shallow nanopores. These nanowells have been developed into hydrogen sensors with Pd nanoparticle decoration. In addition, these nanowells give rise to interference colors and the interference spectra are sensitive enough to pick up one monolayer of explosive molecules such as di- and tri-nitrotoluene. Due to the high aspect ratio (>1,000) in the AAO nanopores, the AAO membranes are reported to lead to highly anisotropic etching and are being developed into various MEMS (micro-electromechanical system) devices such as RF MEMS inductor, microcantilevers, capacitive MEMS humidity sensor, and various gas sensors, etc.

The chemical composition of the AAO film is primarily amorphous alumina ($Al_2O_3$). The chemical inertness and the mechanical hardness make the AAO thin films ideally suited for surface protection as well as metal finishing and decorative purposes. The free standing membranes with different pore sizes are also commonly used for filtration and separation in chemical and biotech labs. The chemical inertness also makes the AAO an ideal template for nanoscale synthesis. Most applications do not require long range order in the pore arrays. However, long range order can be established with use of more sophisticated and expensive methods such as photo- and e-beam lithography, as well as focused ion beam (FIB). With long range order in the nanopore arrays, more advanced development in electronic and magnetic devices as well as photonic applications are expected in the future.

The formation mechanism of AAO membranes was first proposed in the early 1950s. Key elements of AAO membranes consist of straight nanopores with a spherical bottom less than a hemisphere. The contour of the cell base pattern can be described with a center of curvature and a radius of curvature. The earlier model was expanded significantly in the 1970s. The revised model is shown in FIG. 1. The center of curvature (A) is continuously moving downward during anodization. The active layer during nanopore growth is the bottom barrier layer with thickness (d). There are two active interfaces on the barrier layer. The outer one is associated with anodization of aluminum to alumina, and the inner one associated with dissolution and deposition of alumina to and from the etching solution. The process is driven by the local electric field (E) which is defined by the applied current (I) over conductivity ($\sigma$) times the surface area of the spherical bottom $(\omega/4\pi) \times 4\pi b^2 = \omega b^2$ where $\omega$ is the solid angle and b radius of curvature.

Under a constant applied current (or potential E) and during equilibrium growth, each nanopore reaches an optimized solid angle $\omega$ and radius of curvature b. Each nanopore slowly moves its position with respect to its closest neighbors in order to even out the mechanical stress among them. This self assembly process leads to nanopores with uniform pore diameter and arranged in a two-dimensional hexagonally close packed array. This self-assembly process in AAO formation is a slow process and takes hours to reach equilibrium. A commonly accepted procedure to prepare well ordered AAO membranes is called two-step anodization. The concept of the two-step anodization is to first generate aligned nanopores, followed by removal of the initial surface alumina layer. This process generates highly ordered indents on the unreacted aluminum surface. These surface indents serve as the nucleation sites and lead to deep nanopores during the second anodization. Typical Al surfaces with ordered indents are shown in FIG. 2 with indent (pore) diameters around 50 nm and pore-to-pore distance ~110 nm (prepared from 40 V and 0.3 M oxalic acid).

Typical anodization working ranges and the resulting pore-to-pore distances are, respectively, 10-25 V and 35-70 nm for sulfuric acid, and 30-60 V and 80-150 nm for oxalic acid. These conditions are considered "mild anodization" and the AAO growth rate is relatively slow. Recently, the working ranges for oxalic acid has been extended to 120-150 V with the corresponding pore-to-pore distance expanded to 220-300 nm under the "hard anodization" condition. With a combined oxalic acid anodization followed by phosphoric acid anodization at 185 V, a pore-to-pore distance over 400 nm can be reached as shown in FIG. 3.

In addition to large pore distance, another direction in the synthesis of AAO films is to go beyond the 2D hexagonal pore arrays toward 3D periodically perforated nanostructure network. A cyclic anodization process has been developed where an oscillatory current signal is applied to create AAO with pore diameter modulated by the applied current. The pore segments with larger diameter can be etched through to prepare periodically perforated nanopores. Another approach is to apply combined sequential mild anodization and hard anodization with pulsed anodization potentials to produce a lamellar typed 3D structure.

While there has been progress using AAO membranes for a variety of nanotech applications, an MCP detector has not been achieved using AAO membranes and conventional methods of creating AAO pore arrays have not been successful. Further, CVD based deposition processes generally lack thickness control, which may easily plug pores less than 200 nm in diameter, and therefore is generally not suitable for nanoscale fabrication. In particular, there is a substantial need for MCP detectors with micro-channel plates of much smaller intrinsic channel diameter (less than 1 micrometer), and micro-fabricated pores between approximately 1-25 micrometers and having a much faster response detection time of less than about 100 psec.

SUMMARY

The present invention includes an MCP detector designed for radiation detection and signal amplification applications fabricated from an anodized aluminum oxide (AAO) membrane containing a range of nanopores with about 10 nm to 500 nm pore diameters and then coated by an atomic layer deposition (ALD) process. The AAO membranes also can be prepared to have substantially uniform nanopores for each of the membranes with the values ranging over the above recited 10-500 nm pore diameters. Additional surface patterning techniques such as focused ion beam (FIB), lithography, and laser writer can be used to pattern the Al surface deposited on the AAO, to add features from intrinsic 10 nm to patterned 25 micrometers.

This MCP detector is fabricated based on AAO/ALD for micro-channel plates with much smaller intrinsic channel diameter (≤1 micrometer), micro-fabricated pores of about 10-500 nm, leading to MCP detector channels of about 1-25 micrometers in diameter and faster detector response time (less than 100 psec). Large-area AAO membranes and/or use of AAO imbedded in an Al frame in a tile format can be used to construct large-area MCP devices. The nanopores in AAO are generated with either hard anodization (200 nm to 1 micron pore-to-pore distance) or mild anodization (20-200 nm pore-to-pore distance).

AAO can be fabricated by combining surface patterning techniques such as focused ion beam (FIB), photo- and electron beam lithography (e-beam), laser writer, and nanoimprint with anodization to fabricate the precise pattern designed for the specific MCP applications.

The above aspects and features, objects and advantages of the present invention will be more clearly understood from the following detailed description taken in conjunction with the accompanying drawings described below.

BRIEF DESCRIPTION OF THE DRAWINGS

FIG. 10 shows a flat Al surface disposed on top and a textured Al surface with a bias angle θ on bottom;

FIG. 11A shows a typical Al—$Al_2O_3$ sharp interface and FIG. 11B shows a compositionally graded Al-alumina interface;

DETAILED DESCRIPTION OF EMBODIMENTS

Figure 1:
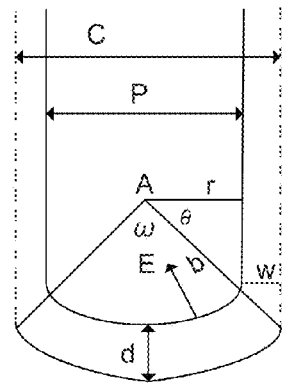
FIG. 1 shows a single AAO pore.
Figure 2:
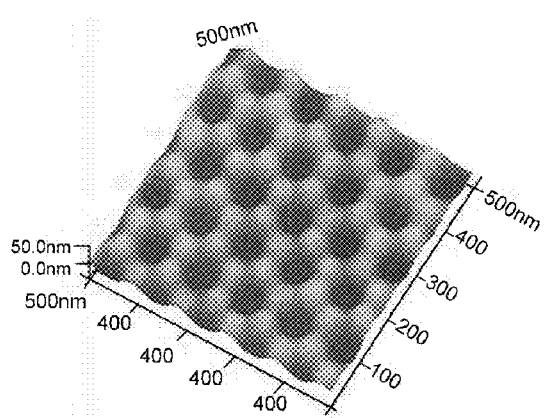
FIG. 2 shows an atomic force microscope image of a 500×500 nm scan of an Al surface with highly ordered indents showing a pore to pore distance of about 110 nm.
Figure 3:
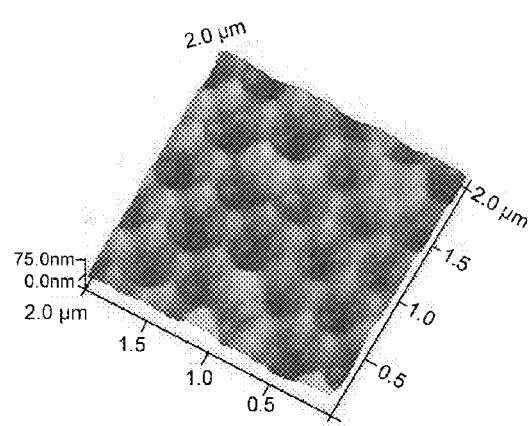
FIG. 3 shows an atomic force microscope image of a 2×2 micrometer scan of an Al surface showing nearly ordered indents with a pore to pore distance of about 400 nm.

Preparation of an MCP detector includes fabrication of an AAO membrane 10 (see FIGS. 1-3). The membranes 10 can have a selectable range of nanopores 20, such as for example, having about 10 nm to 500 nm pore diameters with selected separation distance, such as for example 20 nm to 1 micrometers. These nanopores 20 can then most preferably be coated by an atomic layer deposition (ALD) process to create a desired layer for the MCP detector configuration. Additional surface patterning techniques can also be used to effect the desired MCP detector, such as for example, a focused ion beam (FIB) method, lithography and a laser writer. These techniques are most preferably used to pattern an external Al surface disposed on the AAO membrane 10. As will be described in detail hereinafter, these techniques are used over Al, and AAO membrane 10 directly and Al over the AAO membrane 10. In addition these methods can be applied directly on Al followed by anodization. Laser writer and photolithography techniques can be applied by: a) photoresist over the AAO membrane 10 or b) photoresist over Al over the AAO membrane 10.

Figure 4:
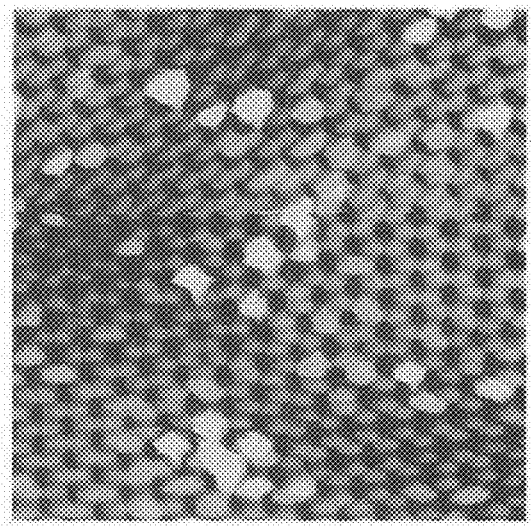
FIG. 4 shows a hard anodized structure in a 5×5 micrometer atomic force microscope image with a pore to pore distance of about 330 nm and a pore diameter of about 150 nm.
Figure 5:
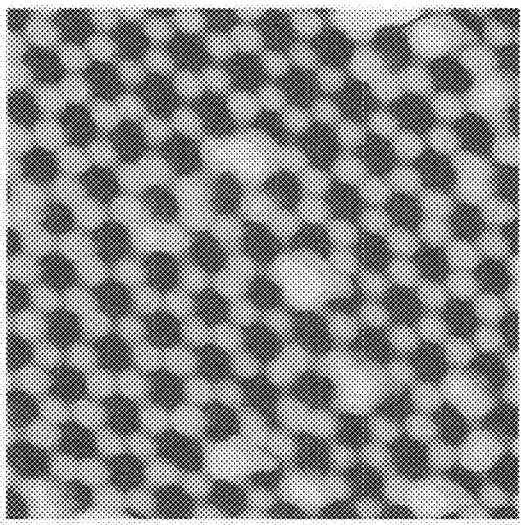
FIG. 5 shows a mild anodized structured in a 1×1 micrometer atomic force microscope image with a pore to pore distance of about 110 nm and a pore diameter of about 50 nm.

The nanopores 20 can be established by standard self assembly techniques, which can be quite slow and conventional ordered pore formation requires a two step anodization. Using conventional FIB and nanoimprint techniques, straight forms of the nanopores 20 develop very quickly upon anodization. Both hard and mild anodization, as well as surface patterned Al together with anodization can be used to prepare the AAO membrane 10 for the MCP detectors. FIGS. 4 and 5 show examples of hard and mild anodization prepared AAO membrane 10.

Figure 6:
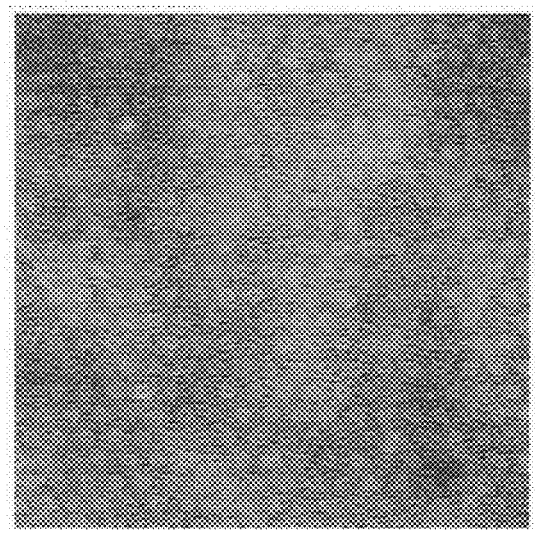
FIG. 6 shows a 10×10 micrometer atomic force microscope image showing an AAO pattern generated by use of a focused ion beam technique followed by anodization to form a structure with about 500 nm pore to pore distances.
Figure 7:
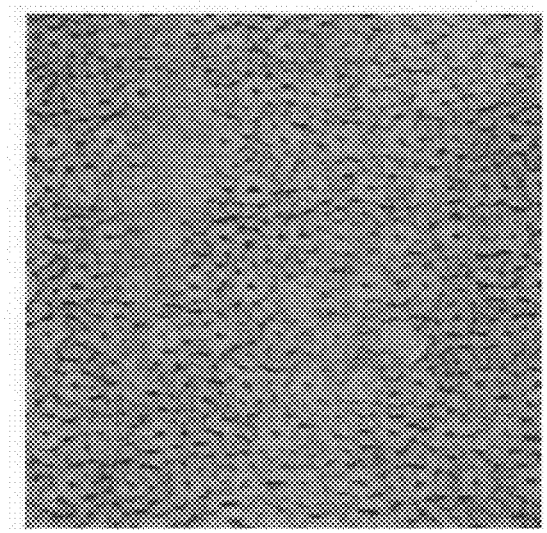
FIG. 7 shows a 5×5 micrometer atomic force image magnified from FIG. 6 and the sample is AAO over an Al substrate.

Further examples of AAO membranes 10 fabricated by using an FIB technique are shown in FIGS. 6 and 7. An initial pore pattern was directly formed over an Al surface followed with anodization under a high DC voltage guided by the pore-to-pore distance versus anodization potential linear correlation.

Figure 8:
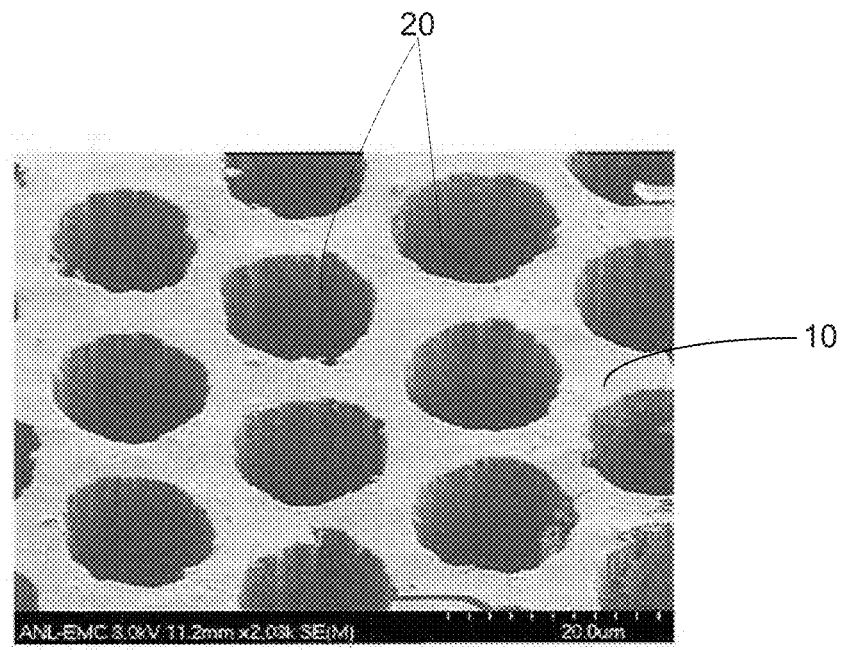
FIG. 8 shows an SEM image with 15 micrometer diameter pores for an AAO structure for constructing an MCP detector, and the pores were formed by laser writer patterning followed by a chemical etch.
Figure 9:
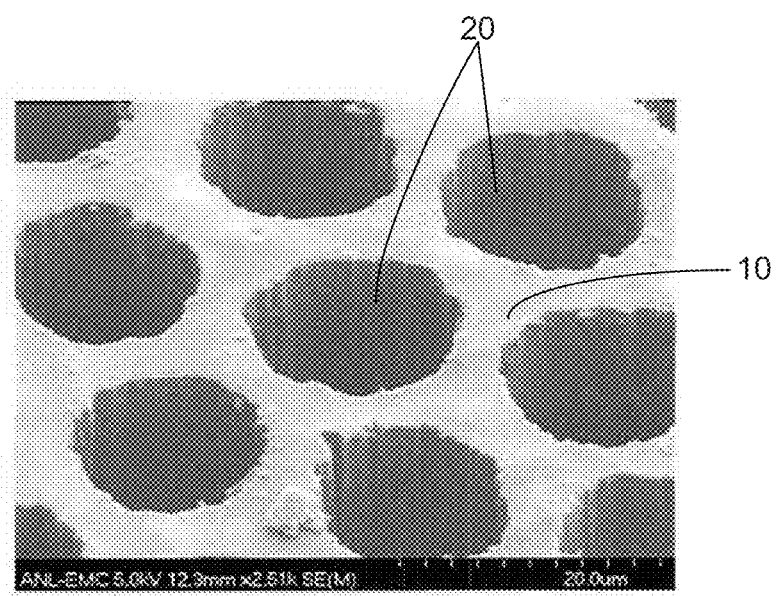
FIG. 9 shows an SEM image of an AAO pattern magnified from FIG. 8 and shows small intrinsic nanopores (about 30 nm pore diameter) that facilitated chemical etching to form the large 15 micrometer pores shown herein.

Examples of the AAO membranes 10 fabricated with a laser writer to prepare pores in the range of about 1 to 25 micrometers are shown in FIGS. 8 and 9. The process involves making the AAO membrane 10 (about 100 microns thick) over an Al sheet, coating the AAO open nanopores 20 with a thin Al layer 15 of about 100 nm thick (see FIGS. 11A and 11B), using a laser writer to prepare a desired pattern, chemically etching to develop the pattern, and finally carrying out chemical etching again to generate the desired pattern in the AAO membrane 10. The AAO membranes 10 have been micro-fabricated at sizes of about one inch diameter, and larger sizes are readily achievable using photolithography or other conventional techniques followed with chemical etching as for the FIB technique.

Additional steps can be performed to develop a bias angle in the AAO membrane 10 (see FIG. 10) as well as a robust Al-Alumina interface. The bias angle in a conventional glass MCP detector is known to increase its efficiency. The bias angle in glass MCP is introduced through forming a cut angle during fiber glass bundle cutting. For the AAO based MCP design herein, a textured Al surface can be prepared by imprint with use of optical gratings or specially designed molds. The nanopores developed during anodization are expected to be normal to the substrate surface. Textured Al surface having facet face 18 is expected to develop a bias angle ($\theta$) for intrinsic pores as shown in FIG. 10. This biased angle can be controlled through a built-in angle on a conventional grating or mold in a known way. Due to the large difference in the thermal expansion coefficients between Al (23.6 ppm/° C., soft and malleable) and alumina (~6 ppm/° C., hard and rigid), the AAO membrane 10 in an Al frame should be able to tolerate stress built-up during any large temperature variation such as during thermal evaporation and resistive heating, etc. The Al-alumina interfacial area during anodization to strengthen the interface. This can be done by purposely varying the anodization area. A schematic drawing to show a suitably graded Al-alumina interface 19 is shown in FIG. 11B.

Examples of the AAO membrane 10 fabricated with a laser writer to prepare nanopores 20 in the range of about 1 to 25 micrometers are shown in FIGS. 8 and 9. The process involves making the AAO (about 100 microns thick) over an Al sheet, coating the AAO open nanopores 20 with a thin Al layer 15 (about 100 nm thick) shown in FIGS. 11A and 11B, using a laser writer to prepare the desired pattern, chemical etching to develop the pattern, and finally carrying out chemical etching again to generate the desired pattern in the AAO membrane 10.

Figure 13A:
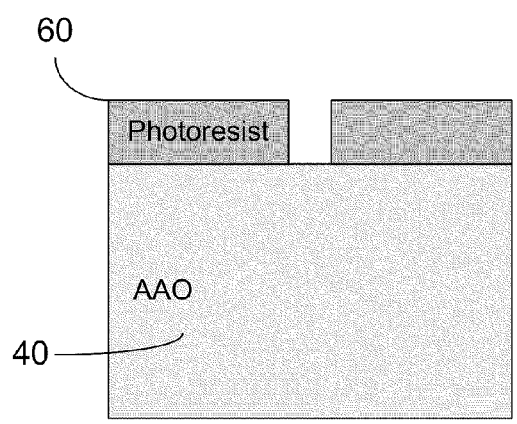
FIG. 13A-13D show the sequence in processing an AAO membrane by etching to prepare open AAO channels with a funnel-shaped entrance.
Figure 13B:
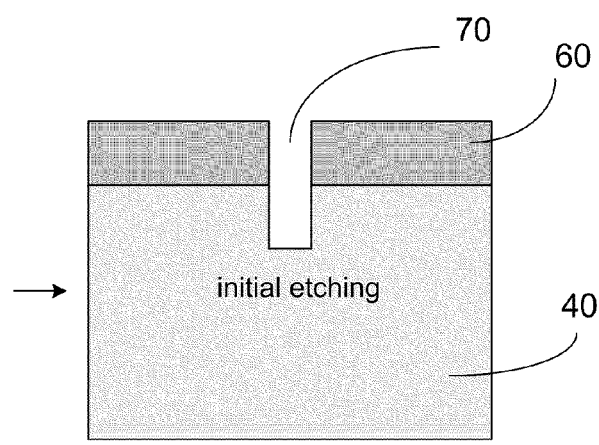
Figure 13C:
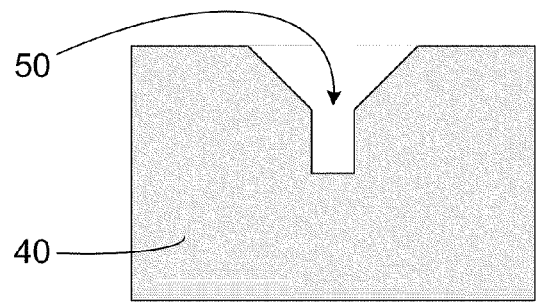
Figure 13D:
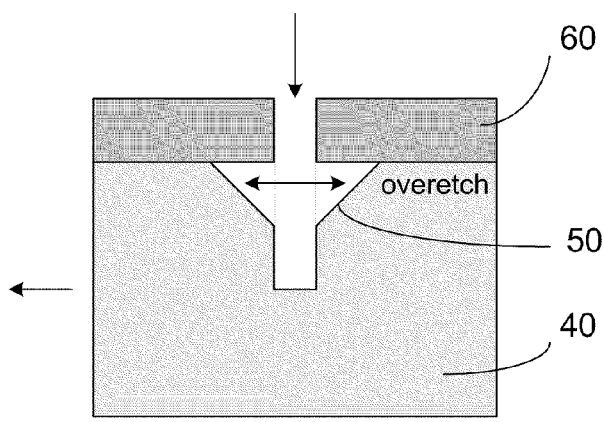
Figure 14:
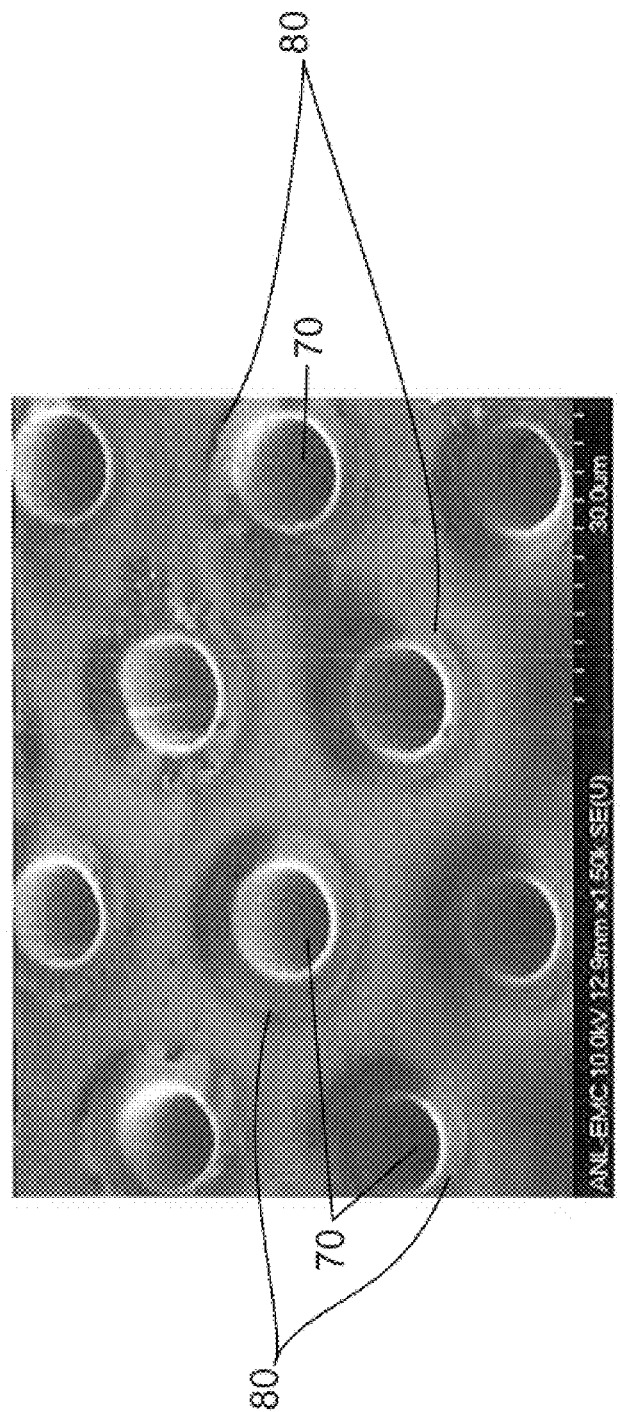
FIG. 14 shows an SEM micrograph image of an AAO membrane with 40 nm intrinsic nanopores and 10 micrometer diameter patterned channels with a widened funnel-shaped channel entrance.

In the design of the AAO based MCP plates 40 for a detector, in order to enhance the radiation capture and to guide the flow of the emitted secondary electrons, it is desirable to have a funnel-shaped channel entrance 50 (see FIGS. 13C-13D and 14). The funnel-shaped entrance 50 can be fabricated with use of a photoresist layer 60 and an overetch process. As shown in FIGS. 13A and 13B, initial etching of the AAO membrane 10 leads to a straight channel 70. The etching rate may be controlled with the chemical etching solution, solution concentration, etching temperature, and etching time, etc. The vertical etching propagates at a faster rate than the horizontal etching under the photoresist layer 60 due to overetching propagating at a slower rate. Through proper control of these etching processes, the funnel-shaped channel entrance 50 may be constructed (see FIGS. 13C and 13D). Such an example, although not yet optimized, is shown in FIG. 14. Vertical etching leads to straight 10-micron diameter channels 70 and overetching leads to funnel-shaped rings 80 about 4-micron wide around each funnel-shaped channel entrance 50.

For both the intrinsic nanopores 20, as well as the open channels 50 prepared through fabrication techniques, the open channel diameter in the AAO membrane 10, the channel-to-channel distance, the channel length/diameter (or the aspect ratio) can all be controlled through anodization and design. For the patterned open channels 50, in order to retain the mechanical strength of the AAO membrane 10, un-etched areas may be intentionally left. The large area MCP plates 40 of a detector, such as 8×8 in$^2$, can be constructed in a floor tile layout with un-etched aluminum framework.

After the AAO-based micro-channel plate components are developed as described hereinbefore, ALD is used to deposit well controlled thin films 30 to tune the electrical resistance of the AAO based components and also to enhance secondary electron emission to provide the preferred radiation sensitive channels of the MCP plates 40. The tunable resistance thin films 30 can be comprised of mixtures of a conducting material such as zinc oxide, tin oxide, indium oxide, etc. with an electrically insulating material such as aluminum oxide, titanium oxide, zirconium oxide, niobium oxide, or magnesium oxide. By adjusting the ratio between the conducting and insulating components, the resistance of the mixed material can be tuned precisely. The material with high secondary electron emission ($\epsilon$) can be, for instance, ALD aluminum oxide ($\epsilon=6$) or magnesium oxide ($\epsilon=3$).

In addition to performing these electronic functions, the ALD coatings will also serve the mechanical function of sealing off the intrinsic pores of the AAO (~20-40 nm) leaving only the micropores used for amplification. This will reduce the surface area of the MCP plates 40 thereby lowering the outgassing under high vacuum. In addition, it will improve the response uniformity of the device by eliminating any signals originating from the intrinsic pores. The conformal ALD films 30 will also assist in smoothing out sharp surfaces produced during the chemical etching step (FIGS. 8 and 9) thereby reducing field emission when bias is applied to the MCP plates 40.

Figure 12:
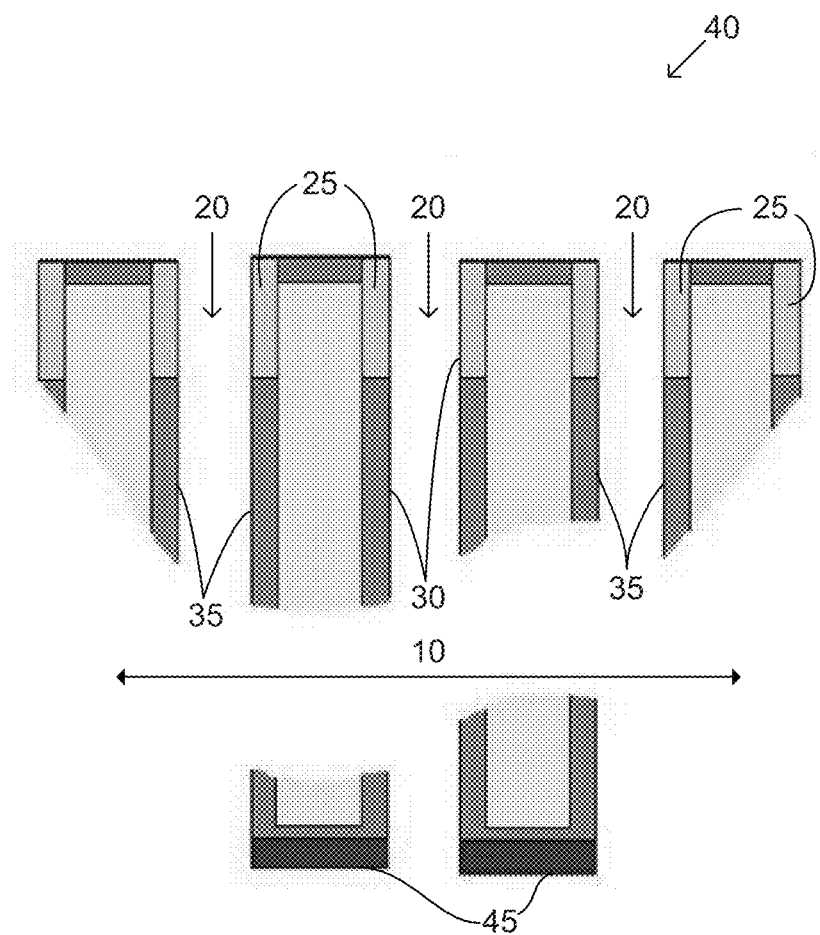
FIG. 12 is a schematic of a micro-channel plate constructed in accord with the invention.

Controlled ALD methods can be used to further process the MCP plates 40. Materials can be deposited at precise depth locations. These methods allow "stripes" of one or more material with different compositions to be applied at controlled positions along the AAO nanopores 20. For instance, a stripe of photocathode material 25 can be deposited at the entrance of the nanopores 20, followed by a material 35 with high secondary electron coefficient. Finally, a metallic anode material 45 could be deposited on the opposite end of the AAO nanopores 20 (see FIG. 12). In this way, an MCP light sensor form of the MCP plates 40 for a detector could be fabricated using ALD and the AAO membranes 10. Such a form of the MCP plates 40 for a detector could be located adjacent to a Cerenkov radiation material to detect high energy particles.

Using ALD to prepare multiple stripes of high secondary electron coefficient material at controlled depth locations within the AAO nanopores 20 will allow fabrication of the MCP plates 40 that function as a discrete dynode chain similar to those used in photomultiplier tubes (PMTs). In general, conventional PMTs are very expensive, and the technology is not scalable to large areas. Both the AAO synthesis and the ALD modification technologies are scalable to large areas and this will make fabrication of the MCP plates 40 more cost effective.

The resulting MCP plates 40 have much smaller intrinsic channel diameter (less than 1 micron), micro-fabricated pores (1-25 microns), and faster detector response time (less than 100 psec). Hard and mild anodization and surface patterning techniques combined with anodization are applied to fabricate the designed MCP plates 40. The surface of the nanopores 20 are sensitized with suitable conductive and emissive oxide thin films with preferred use of ALD.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A micro-channel plate detector, comprising:
   an anodized aluminum oxide membrane having a plurality of fabricated nanopores with an exterior surface therethrough having a pattern applied along the exterior surface; and
   a thin film disposed within at least a portion of the plurality of nanopores and the nanopores being open and unplugged, the thin film being conductive and emissive and responsive to incident radiation, the thin film comprising a conducting material and an insulating material and an emissive material, thereby providing a plurality of radiation sensitive channels formed from the nanopores for the micro-channel plate detector.

2. The micro-channel plate detector, as defined in claim 1, wherein the thin film comprises an atomic layer deposited material.

3. The micro-channel plate detector, as defined in claim 1, wherein the nanopores have a diameter of about 10 nm to 500 nm.

4. The micro-channel plate detector, as defined in claim 3, wherein the plurality of nanopores have a substantially uniform diameter.

5. The micro-channel plate detector, as defined in claim 1, wherein the radiation sensitive channels have a diameter of about 1-25 micrometers.

6. The micro-channel plate detector, as defined in claim 1, wherein the pattern comprises a textured coating comprising a faceted layer.

7. The micro-channel plate detector, as defined in claim 6, wherein the faceted layer includes a bias angle.

8. The micro-channel plate detector, as defined in claim 1, wherein an Al anodized aluminum oxide interface is selected from the group consisting of a sharp interface and a graded interface.

9. The micro-channel plate detector, as defined in claim 1, further including additional patterned layers on the anodized aluminum oxide membrane for the radiation sensitive channels.

10. The micro-channel plate detector, as defined in claim 1, wherein each of the plurality of nanopores comprises a funnel-shaped channel entrance.

11. The micro-channel plate detector, as defined in claim 1, wherein the conducting material is selected from the group consisting of zinc oxide, tin oxide and indium oxide, and the insulating material is selected from the group consisting of aluminum oxide and magnesium oxide, thereby enabling tuning of electrical resistance of the thin film.

12. The micro-channel plate detector, as defined in claim 2, wherein the anodized aluminum oxide includes intrinsic pores sealed by the atomic layer deposited material.

13. The microchannel plate detector of claim 1, wherein the thin film is disposed as a stripe within each of the plurality of nanopores.

14. The microchannel plate detector of claim 13, wherein a plurality of stripes of the thin film are disposed within each of the plurality of nanopores.

15. The microchannel plate detector of claim 13, wherein a stripe of photocathode material is deposited at the entrance of the nanopores.

16. The microchannel plate detector of claim 15, wherein a metallic anode material is deposited opposite the photocathode material.

17. The microchannel plate detector of claim 1, wherein the thin film comprises a mixture of the conducting material and the insulating material.

* * * * *

UNITED STATES PATENT AND TRADEMARK OFFICE
CERTIFICATE OF CORRECTION

PATENT NO. : 9,139,905 B2
APPLICATION NO. : 13/032395
DATED : September 22, 2015
INVENTOR(S) : Elam et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 89 days.

Signed and Sealed this
Twenty-fourth Day of May, 2016

Michelle K. Lee
*Director of the United States Patent and Trademark Office*